(12) United States Patent  
Jung et al.

(10) Patent No.: US 7,952,210 B2
(45) Date of Patent: May 31, 2011

(54) SEMICONDUCTOR PACKAGE AND FABRICATION METHOD THEREOF (75) Inventors: Gi-Jo Jung, Incheon-si (KR); In Soo Kang, Cheongju-si (KR); Jong Heon Kim, Seongnam-si (KR); Seung Dae Baek, Cheongju-si (KR)

(73) Assignee: NEPES Corporation, Chungbuk (KR)

( * ) Notice: Subject to any disclaimer, the term of this patent is extended or adjusted under 35 U.S.C. 154(b) by 608 days.

(21) Appl. No.: 12/023,761

(22) Filed: Jan. 31, 2008

(65) Prior Publication Data
US 2008/0203583 A1    Aug. 28, 2008

(30) Foreign Application Priority Data

Feb. 26, 2007 (KR) .................. 10-2007-0019127

(51) Int. Cl.
*H01L 23/52* (2006.01)
*H01L 23/48* (2006.01)
*H01L 29/40* (2006.01)

(52) U.S. Cl. ............ 257/781; 257/E23.041; 257/780; 257/786; 438/109; 438/614

(58) Field of Classification Search .......... 257/777, 257/779, 737, 758, E21.001, E23.141, E23.041, 257/E23.021, E23.069, 685, 686, 778, 780, 257/781, 786; 438/108, 109, 612, 614; 361/760
See application file for complete search history.

(56) References Cited

U.S. PATENT DOCUMENTS

| | | | | |
|---|---|---|---|---|
| 5,784,261 A * | 7/1998 | Pedder | ........................... | 361/767 |
| 6,235,552 B1 * | 5/2001 | Kwon et al. | .................. | 438/106 |
| 6,380,615 B1 * | 4/2002 | Park et al. | .................... | 257/686 |
| 6,784,547 B2 * | 8/2004 | Pepe et al. | ..................... | 257/758 |
| 6,830,956 B2 * | 12/2004 | Masumoto et al. | ........... | 438/108 |
| 6,884,652 B2 * | 4/2005 | Huang et al. | .................... | 438/106 |
| 7,183,652 B2 * | 2/2007 | Waidhas et al. | ................ | 257/772 |
| 7,327,032 B2 * | 2/2008 | Yoon | .............................. | 257/737 |
| 7,510,889 B2 * | 3/2009 | Pan et al. | ........................ | 438/26 |
| 7,545,037 B2 * | 6/2009 | Lee | ................ | 257/734 |
| 7,589,426 B2 * | 9/2009 | Jiang et al. | ..................... | 257/780 |
| 2003/0011069 A1 * | 1/2003 | Shibata | ........................ | 257/734 |
| 2004/0164385 A1 * | 8/2004 | Kado et al. | ..................... | 257/678 |
| 2004/0245630 A1 * | 12/2004 | Huang et al. | .................. | 257/737 |
| 2005/0161826 A1 * | 7/2005 | Shah et al. | .................... | 257/758 |
| 2005/0179131 A1 * | 8/2005 | Homma | ........................ | 257/737 |
| 2005/0258537 A1 * | 11/2005 | Huang et al. | .................. | 257/738 |

* cited by examiner

*Primary Examiner* — Chris Chu

(57) ABSTRACT

There is provided a semiconductor package comprising: a multilayer thin film structure including a plurality of dielectric layers and at least one or more redistribution layers; a semiconductor chip positioned at one side of the multilayer thin film structure and electrically connected to the redistribution layer; and a solder bump formed at the other side of the multilayer thin film structure. The multilayer thin film structure functions as the substrate for the semiconductor package and realizes the light, thin, short and small BGA package without any additional substrate. A plurality of the packages can be simultaneously formed at wafer level or carrier level, to simplify the process and to be favorable for mass production. After the semiconductor chips are formed at wafer level, only the semiconductor chips having the excellent operation characteristic through the test are selectively bonded to the multilayer thin film structure, to provide the high quality package products in which the fault rate is maximally reduced. The light, thin, short and small BGA package according to the present invention enables small and slim communication devices, displayers and other diverse electronic devices, to be contributed to the increase of the competitiveness of the products to which the BGA package is applied.

16 Claims, 11 Drawing Sheets

SEMICONDUCTOR PACKAGE AND FABRICATION METHOD THEREOF

RELATED APPLICATIONS

This application is a U.S. national phase application of Korean Patent Application No. 2007-019127, filed Feb. 26, 2007, the contents of which are incorporated herein by reference in their entirety.

FIELD OF THE INVENTION

The present invention relates to a semiconductor package and a fabrication method thereof, and more particularly, to a light, thin, short and small semiconductor package in which a semiconductor chip is directly bonded to a multilayer thin film structure, without using any substrate for the package, and a method of fabricating the same at wafer level or carrier level.

BACKGROUND OF THE INVENTION

A semiconductor device is capable of realizing diverse operation by a number of electric devices integrated in a single substrate. For this purpose, various high-technical fabrication methods have been used, and each device in semiconductor device fabrication has been developed in miniaturized form as a component in smaller dimensions.

Semiconductor systems of high-integration and high-capacity have been proposed by developing the technology of packaging semiconductor devices. The semiconductor packaging technology has been changed from a wire bonding to a flip-chip bumping capable of realizing a chip scale, to meet the market requirements.

Figure 1:
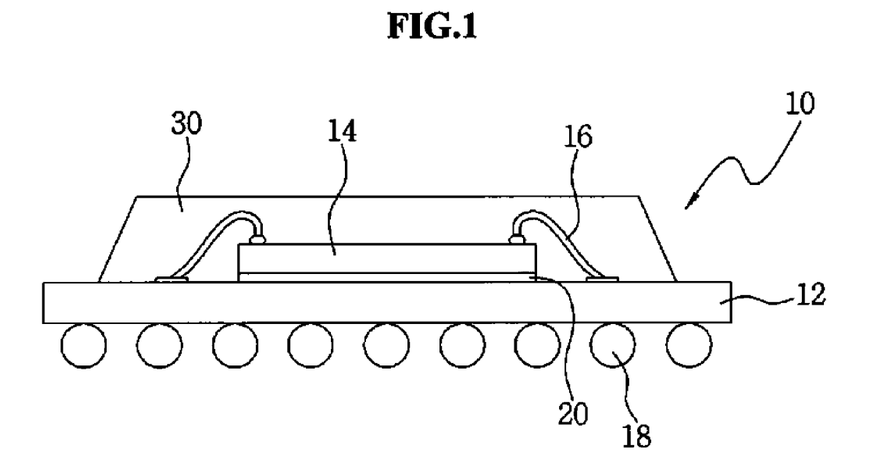
FIG. 1 is a sectional view of a conventional BGA package structure.

FIG. 1 is a sectional view illustrating an example of a structure of a conventional ball grid array (BGA) package 10. An individual semiconductor chip 14 is bonded to one side of a substrate 12 for a package by a bonding layer 20, and a part of the semiconductor chip is electrically connected to a part of the substrate by a wire 16. A number of solder bumps 18 are formed on the bottom surface of the substrate, and a protecting molding 30 to cover the semiconductor chip and the wire is formed on the top surface of the substrate.

As described above, in the conventional art, a substrate with a predetermined thickness is needed for the package of the semiconductor chip. When the semiconductor chip operates, signals are transferred through the electrical interconnection from the wire formed on the top surface of the substrate to the solder bumps formed on the bottom surface of the substrate. However, as a semiconductor device has been developed, the operation speed of the semiconductor device has been remarkably improved. Then, when an interconnection length within a package is long, a signal is delayed or a distortion is serious upon high-speed operation or high-capacity signal process, thereby failing to satisfy the requirements for various application devices.

Moreover, since the substrate of a predetermined thickness is needed for a package, there are limits in reducing the size and thickness of the whole package. Consequently, the substrate becomes an obstacle in developing communication devices or electronic devices to be small or slim.

Moreover, the conventional BGA package technology has a limit in realizing diverse stacked packages or systemized packages and is not effective in mass production.

Therefore, the present invention is directed to provide a new BGA package which is very thin in thickness and simple in structure.

Another object of the present invention is to provide a BGA package which has a short electrical interconnection length, to be favorable for high speed operation.

Another object of the present invention is to provide a BGA package which is easily stacked and mounted on the surface.

Another object of the present invention is to provide a method of fabricating a BGA package, which is favorable in mass production, has a simple process and significantly reduces a fault rate.

The other objects and characteristics of the present invention will be presented in more detail below:

In accordance with an aspect of the present invention, the present invention provides a semiconductor package comprising: a multilayer thin film structure including a plurality of dielectric layers and at least one or more redistribution layers; a semiconductor chip positioned at one side of the multilayer thin film structure and electrically connected to the redistribution layer; and solder bumps formed the other side of the multilayer thin film structure.

The semiconductor chip may include at least one or more redistribution layers or may be bonded to the multilayer thin film structure without any redistribution layers. The semiconductor chip may be electrically connected to the multilayer thin film structure by the bumps or wire, or two or more semiconductor chips to be stacked may be positioned at one side of the multilayer thin film structure. When a plurality of the semiconductor chips are positioned at the multilayer thin film structure, one semiconductor chip may be electrically connected to the multilayer thin film structure by the bumps and the other semiconductor chip may be electrically connected to the multiple thin film structure by the wire.

The semiconductor package further includes a molding part formed at one side of the multilayer thin film structure in a lateral direction of the semiconductor chip. The molding part may be formed to be lower than the top surface of the semiconductor chip, to minimize the entire thickness of the semiconductor package.

The multilayer thin film structure may be used as a substrate of the semiconductor package, to realize a flip chip package. Since a plurality of the packages can be simultaneously formed at wafer level or carrier level, a process is simple and is favorable in mass production.

The multilayer thin film structure may perform an additional function because a thin film passive device is embedded inside. The thin film passive device may include at least one of, for example, a capacitor, an inductor and a resistor.

Between the redistribution layer of the multilayer thin film structure and the solder bumps, at least one metal layer may be formed, and the metal layer may include an electrode pad and an under bump metal.

The semiconductor package according to the present invention can be realized as an extremely light, thin, short and small package. Furthermore, a plurality of these semiconductor packages can be very easily stacked. Specifically, a stacked semiconductor package can be provided by electrically connecting and vertically positioning two or more semiconductor packages, each package comprising a multilayer thin film structure including a plurality of dielectric layers and at least one or more redistribution layers; a semiconductor chip positioned at one side of the multilayer thin film structure and electrically connected to the redistribution layer; and solder bumps formed the other side of the multilayer thin film structure, by the solder bumps. In this case, one BGA package may be electrically connected to one side of the multilayer thin film structure of the other BGA package through the solder bump. Further, a systemized package can be realized by vertically stacking the BGA packages or horizontally mounting the BGA packages on a separate printed circuit board.

The light, thin, short and small stacked package according to the present invention enables communication devices, displays and the other various electronic devices to be small and slim and is contributed to the increase of competitiveness of the products to which the package is applied.

In accordance with another aspect of the present invention, the present invention provides a method of fabricating a semiconductor package, comprising steps of: forming a multilayer thin film structure including a plurality of dielectric layers and at least one or more redistribution layers; arranging a semiconductor chip at one side of the multilayer thin film structure and electrically connecting the semiconductor chip to the redistribution layer; and forming solder bumps at the other side of the multilayer thin film structure.

Preferably, the multilayer thin film structure may be formed at wafer level or carrier level. After the multilayer thin film structure is electrically connected to the semiconductor chip and the solder bumps are formed, the multilayer thin film structure may be separated into individual packages, to simplify the whole process.

After the semiconductor chip is formed at wafer level, only the semiconductor chip having an excellent operation characteristic, which is selected through a semiconductor chip test at wafer level, is bonded to the multilayer thin film structure, to provide a high quality package product by maximally reducing a fault rate of the semiconductor chip.

Further, the package is fabricated by using an ultra thin film structure of a micrometer level, without any substrate for a package, to make the package thickness to be smallest and by partially forming a molding part to complement a mechanical support force of the multilayer thin film structure. Furthermore, the method of fabricating the semiconductor package further comprise a step of thinning the back surface of a wafer after forming the semiconductor chip at wafer level, to realize an extremely thinned BGA package.

The multilayer thin film structure forms a bonding layer on a wafer or carrier and forms an under bump metal, an electrode pad, a dielectric layer and a redistribution layer on the bonding layer. After the semiconductor chip is electrically connected to the multilayer thin film structure, the wafer or carrier is removed from the multilayer thin film structure.

In accordance with the present invention, a plurality of the packages in which the multilayer thin film structure and the semiconductor chip are connected to each other are simultaneously fabricated at wafer level or carrier level and thereafter are separated into individual packages. Therefore, the semiconductor package according to the present invention is favorable in mass production and reduces the fabrication cost.

DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described more fully hereinafter with reference to the accompanying drawings, in which preferred embodiments of the invention are shown.

Figure 2:
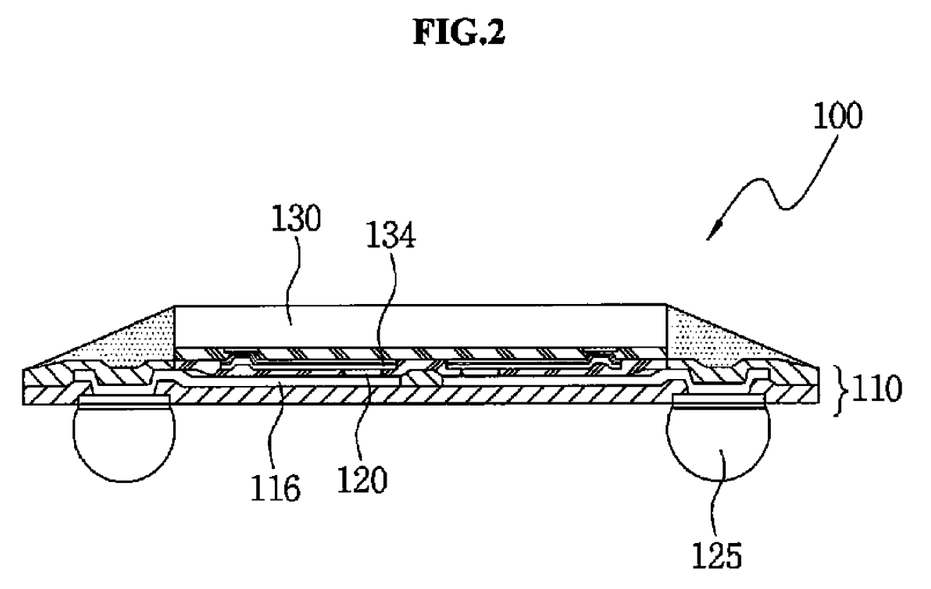
FIG. 2 is a sectional view of a semiconductor package structure according to an embodiment of the present invention.

FIG. 2 is a sectional view of a BGA package 100 according to an embodiment of the present invention. The BGA package 100 is thin, in which a semiconductor chip 130 is bonded to the top surface of a multilayer thin film structure 110 at a lower position.

The multilayer thin film structure 110 has a form of an ultra thin film including a dielectric layer and a redistribution layer. In the drawing, the thickness of the multilayer thin film structure is exaggerated for clarity. However, the actual thickness thereof is below a millimeter, preferably, at a micrometer level.

A part of a redistribution layer 116 formed inside the multilayer thin film structure 110 is electrically connected to the semiconductor chip 130 formed on the top surface thereof by a conductive bump 120. The semiconductor chip 130 may include a redistribution layer 134. In this case, a part of the redistribution layer 134 contacts with the conductive bump 120, to be electrically connected to the multilayer thin film structure.

On the bottom surface of the multilayer thin film structure 110, at least one solder bump 125 is formed, so that the multilayer thin film structure 110 can be mounted on an external circuit or be electrically connected to another package. Further, as illustrated, a molding part 140 is partially formed on the top surface of the multilayer thin film structure 110 in a lateral direction of the semiconductor chip 130, to complement a mechanical support force of the multilayer thin film structure 110. The molding part 140 is partially formed in the lateral direction of the semiconductor chip 130 only and the height of the molding part 140 does not exceed the top surface of the semiconductor chip 130, to realize the BGA package being very thin to be substantially similar to the thickness of the semiconductor chip. Further, since the molding part is not formed on the top surface of the semiconductor chip 130 and is exposed to the outside, heat is advantageously spread out to the outside when the semiconductor chip 130 operates at high speed.

Further, on the top surface of the semiconductor chip 130 where the molding part 140 is not formed, a heat spreader (not shown) may be additionally attached, to improve the heat-spreading from the semiconductor chip 130.

Figure 3:
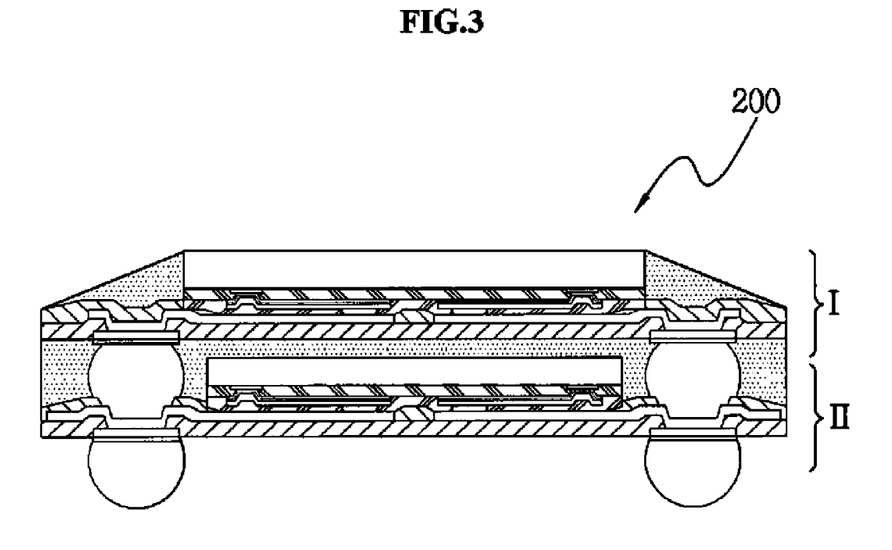
FIG. 3 is a sectional view of a stacked semiconductor package structure according to the present invention.

Not only the BGA package according to the embodiment of the present invention is light, thin, short and small but also a number of the BGA packages are easily mounted on an external circuit substrate horizontally or stacked vertically. FIG. 3 illustrates an example of a stacked semiconductor package 200, in which an upper package I and a lower package II are directly bonded by solder bumps, without any additional substrate for stacking. The solder bumps of the upper package I are electrically connected to one side of a multilayer thin film structure of the lower package II, to significantly reduce the thickness of the stacked package.

The stacked package of a package on package (PoP) type is applied to, for example, the electronic devices or communication devices needing high-capacity memory, for much more increased reliability and value of a consumer product.

Figure 4:
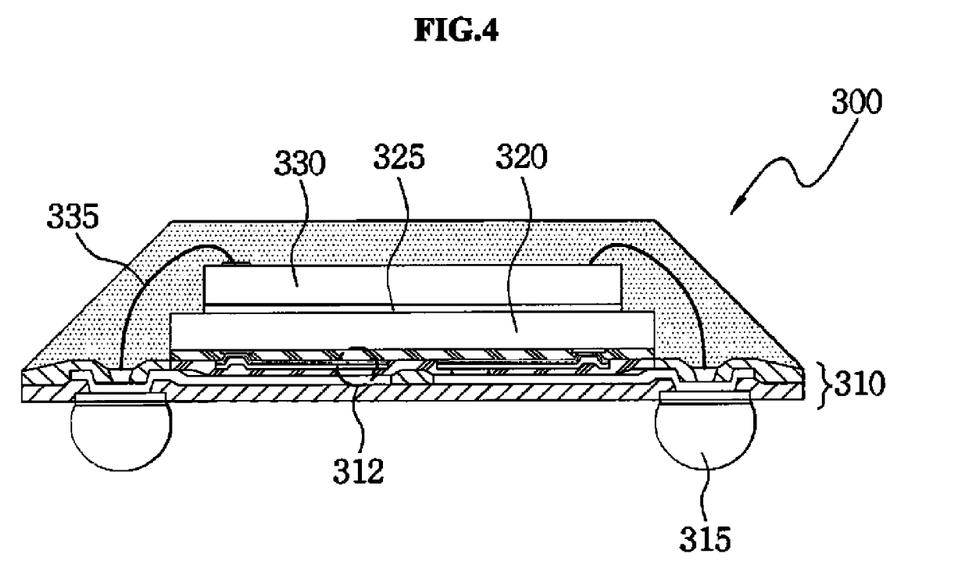
FIG. 4 is a sectional view of another stacked semiconductor package structure according to the present invention.

Further, the BGA package according to the present invention is possible in a structure that one or more semiconductor chips are stacked in the multilayer thin film structure. Referring to FIG. 4, two semiconductor chips 320 and 330 are vertically stacked to be bonded together on a multilayer thin film structure 310. The lower semiconductor chip 320 is electrically connected to the multilayer thin film structure through a solder bump 312, and the upper semiconductor chip 330 is electrically connected to the multilayer thin film structure through a wire 335. Otherwise, all of the upper and lower semiconductor chips may be flip-chip bonded to one multilayer thin film structure through the solder bumps, by differentiating the size of the semiconductor chips being stacked. Further, three or more semiconductor chips may be stacked on the one multilayer thin film structure. Each of the semiconductor chips being stacked may be bonded each other by a bonding layer 325.

The BGA package according to the embodiment of the present invention is fabricated at wafer level or carrier level, to be thinned and favorable in mass production.

FIGS. 5 through 20 illustrate a process of fabricating a BGA package according to an embodiment of the present invention. In FIGS. 5 through 9, there is illustrated a process of fabricating a multilayer thin film structure which functions as a package substrate.

Figure 5:
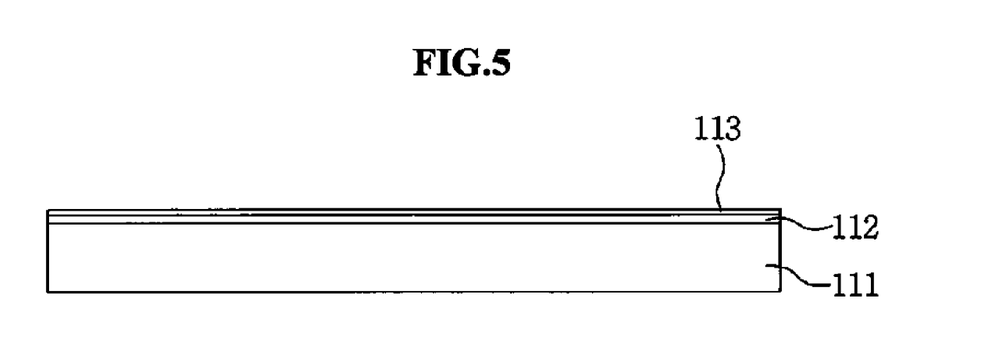
FIGS. 5 through 9 are sectional views illustrating a process of fabricating a multilayer thin film structure at wafer level or carrier level according to an embodiment of the present invention.
Figure 6:
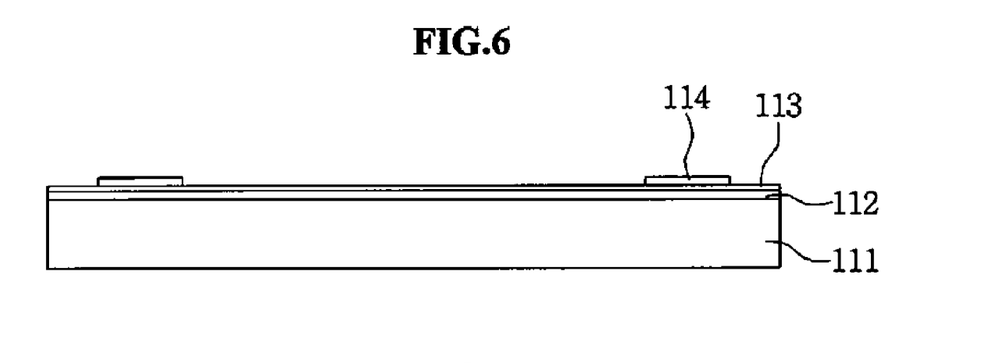

To form a multilayer thin film structure, a wafer or carrier 111 is prepared. A bonding layer 112 to form the thin film structure and remove the carrier (after the process is completed) is formed on the top surface of the carrier 111. An under bump metal 113 is formed on the bonding layer 112 (FIG. 5). The under bump metal 113 may include one or more layers formed of metal or alloy.

The under bump metal 113 may be formed in one layer or in a multilayer structure of two or more layers by selecting one or more substances from, for example, copper (Cu), copper alloy (Cu-alloy), nickel (Ni), nickel alloy (Ni-alloy), tungsten (W), tungsten alloy (W-alloy), titanium (Ti), titanium alloy (Ti-alloy), aluminum (Al), aluminum alloy (Al-alloy), chrome (Cr), chrome alloy (Cr-alloy), gold (Au), gold alloy (Au-alloy), palladium (Pd), palladium alloy (Pd-alloy), antimony (Sb), antimony alloy (Sb-alloy), indium (In), indium alloy (In-alloy), bismuth (Bi), bismuth alloy (Bi-alloy), platinum (Pt) and platinum alloy (Pt-alloy).

Figure 7:
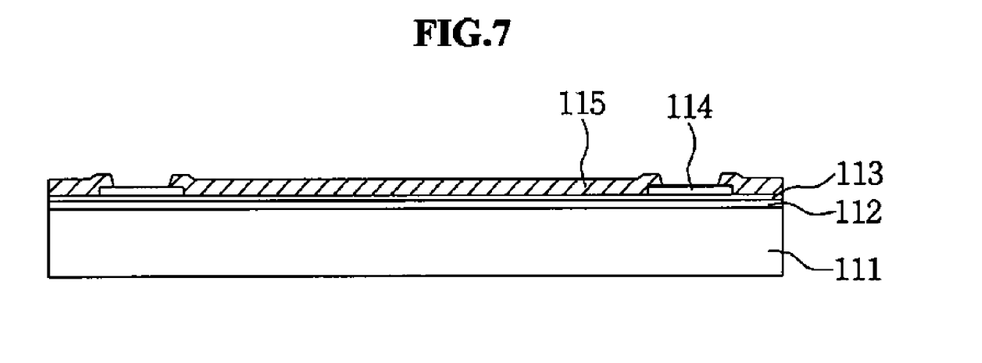
Figure 8:
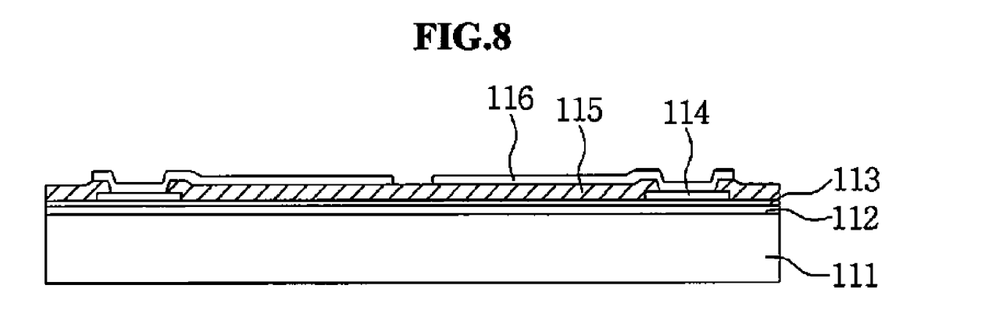

An electrode pad 114 for connecting to a solder bump is formed at a part of the top surface of the under bump metal 113 (FIG. 6), and a first dielectric layer 115 is formed to expose the electrode pad 114 (FIG. 7). After the first dielectric layer 115 is formed, the electrode pad 114 is exposed by partial etching. Since a photo-resist coating process, an exposure process and a partial etching process which are performed to expose the electrode pad 114 are well-known to those skilled in the art, no detailed description will be presented.

Figure 9:
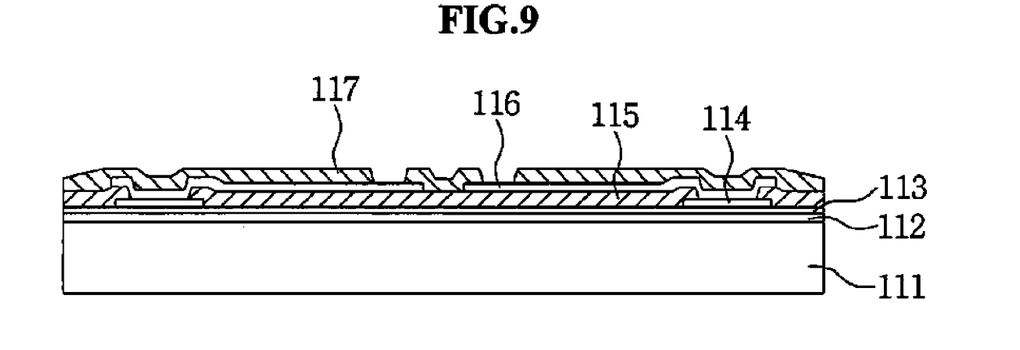

A redistribution layer 116 is partially formed on the top surface of the first dielectric layer 115 (FIG. 8), and a second dielectric layer 117 is formed to partially expose the redistribution layer 116 (FIG. 9).

Although only one individual multilayer thin film structure on the wafer or the carrier 111 is illustrated for clarity, in the actual situation, the multilayer thin film structures for a plurality of the packages are simultaneously formed at wafer level or carrier level, and after the final process is completed, they are divided into individual package.

Since the multilayer thin film structure is formed at wafer level or carrier level, it is easy to adjust the entire thickness and size and consequently it is possible to fabricate the thin and small BGA package. Further, since the length of interconnection from the electrode pad to the solder bump for the electrical connection to the outside is very short, signal delay or distortion is prevented upon high speed operation.

In FIGS. 10 through 13, there is illustrated a process of fabricating a semiconductor chip at wafer level.

A semiconductor chip 130 fabricated at wafer level is prepared. Although a plurality of the semiconductor chips 130 are formed on a wafer, a single chip is illustrated in the drawings for clarity. Inside the semiconductor chip 130, for example, a number of thin film devices (not shown), such as a transistor, a diode and an electrical wire, may be formed. The semiconductor chip may be a memory or a logic circuit.

Figure 10:
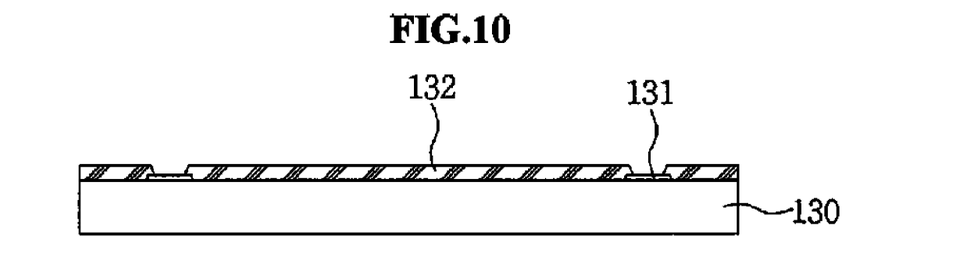
FIGS. 10 through 13 are sectional views illustrating a process of fabricating a semiconductor chip at wafer level according to an embodiment of the present invention.
Figure 11:
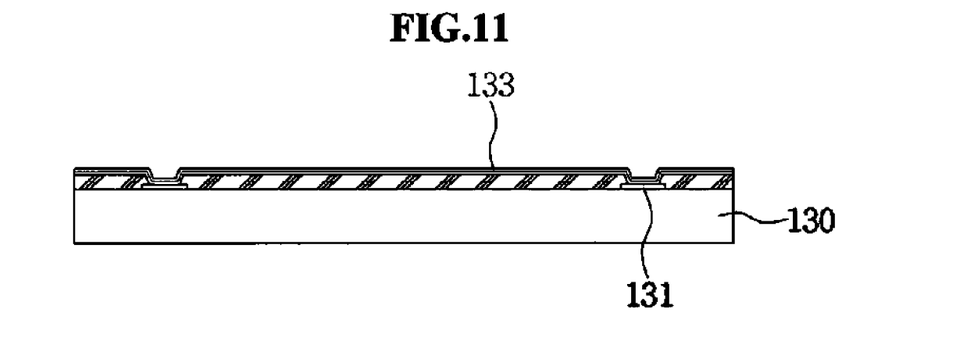
Figure 12:
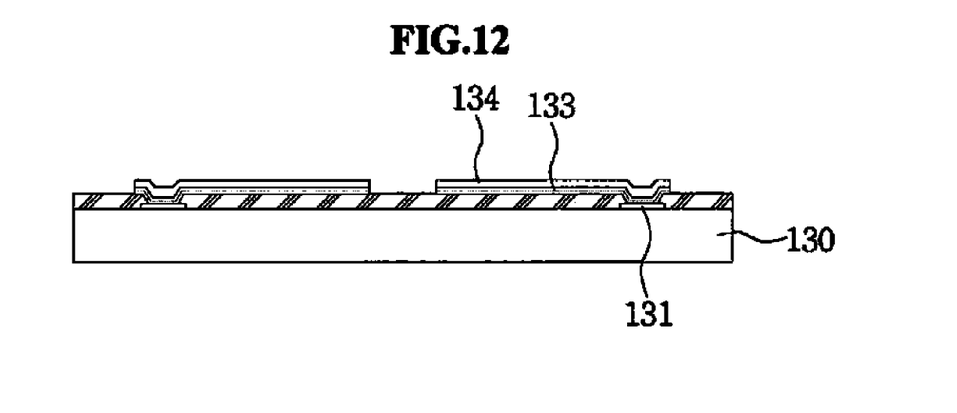

An electrode pad 131 is formed at a part of the top surface of the semiconductor chip 130, and a first dielectric layer 132 is formed to expose the electrode pad (FIG. 10). Subsequently, an under bump metal 133 to electrically contact with the electrode pad 131 is formed (FIG. 11) and then a redistribution layer 134 is formed on the under bump metal 133. The under bump metal 133 and the redistribution layer 134 are partially etched to be patterned (FIG. 12).

Figure 13:
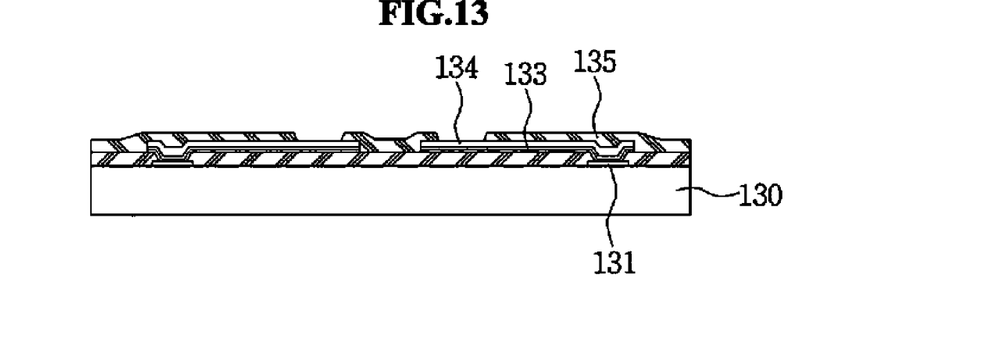

Finally, a second dielectric layer 135 is formed on the redistribution layer 134, so that a part of the redistribution layer 134 is partially exposed.

In the present invention, the semiconductor chip 130 may include the redistribution layer 134 but it may not include the redistribution layer 134 as in another embodiment to be described later.

The semiconductor chip 130 formed at wafer level undergoes a test at wafer level before it is separated into individual chips. After the test at wafer level, the chip having an excellent operation characteristic and having no fault is selected for package.

Before or after the test of the semiconductor chip, a wafer thinning process is performed at wafer level before a solder bump is formed, to much more reduce the thickness of the semiconductor chip.

In FIGS. 14 through 20, there is illustrated a process of bonding a semiconductor chip 130' to a multilayer thin film structure 110'.

Figure 14:
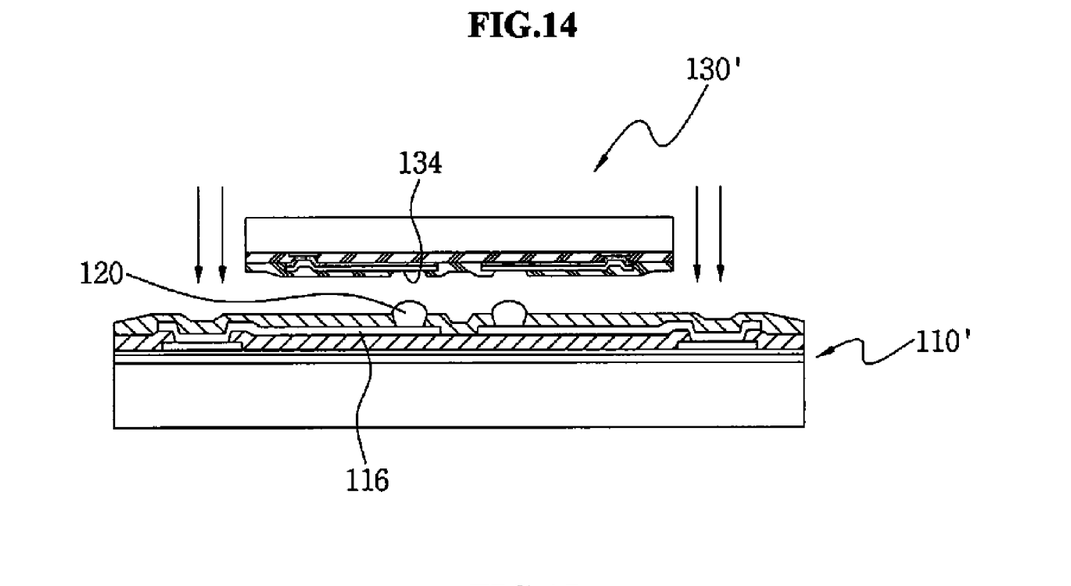
FIGS. 14 through 20 are sectional views illustrating a process of fabricating the semiconductor package according to an embodiment of the present invention.
Figure 15:
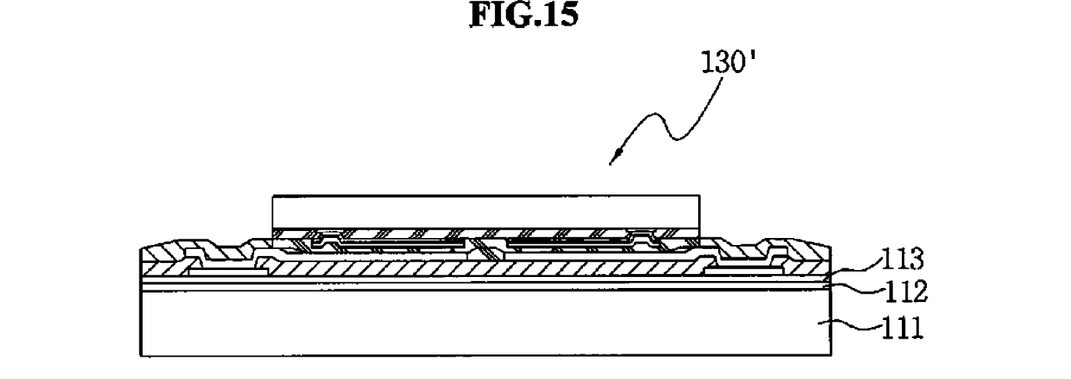

The semiconductor chip 130' having the excellent operation characteristic, which is selected through the test, is arranged in the multilayer thin film structure 110' at wafer level or carrier level (FIG. 14). A conductive bump 120 is formed at an exposed part of a redistribution layer 116 of the multilayer thin film structure 110' or a conductive bump is formed at an exposed part of a redistribution layer of the semiconductor chip 130', to electrically connect the semiconductor chip 130' to the multilayer thin film structure 110' (FIG. 15).

Figure 16:
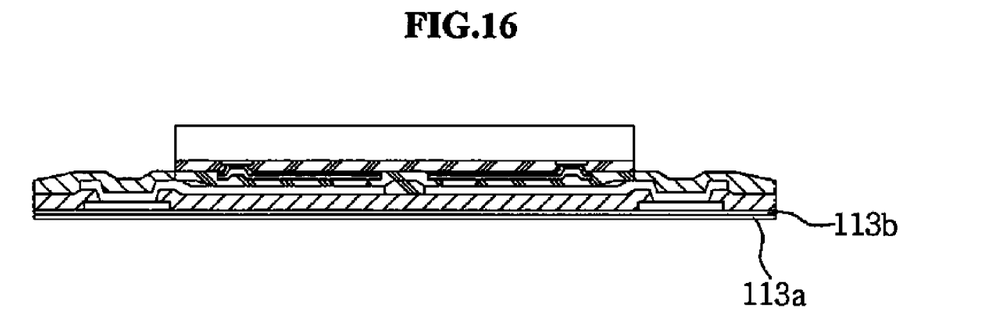
Figure 17:
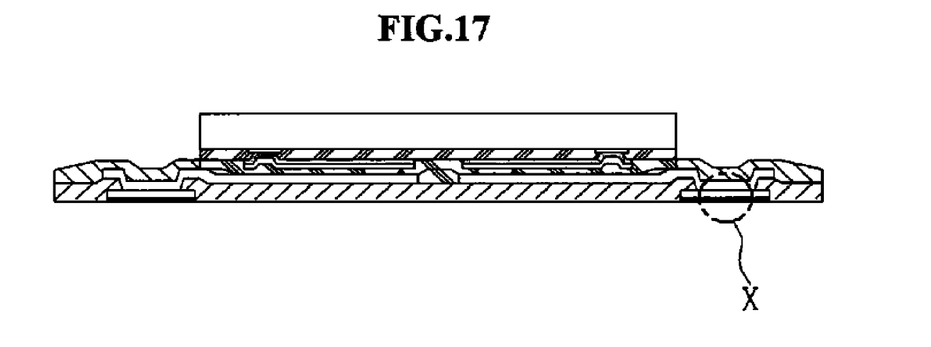
Figure 18:
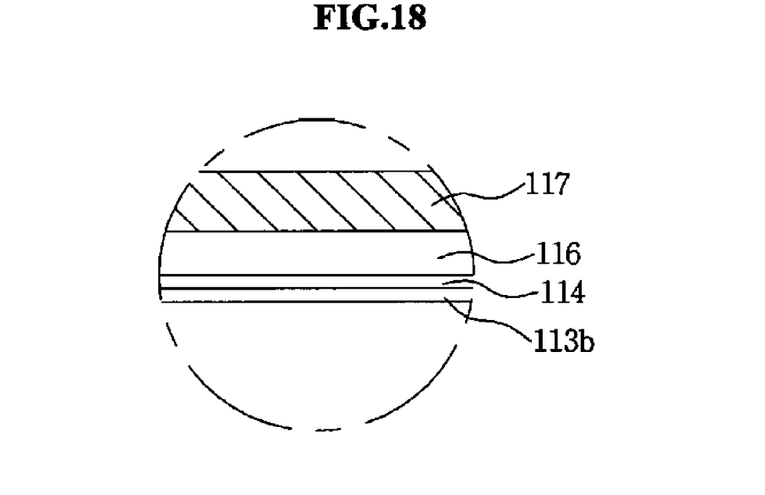

After the connection thereof is completed, the carrier (or wafer) 111 which was used for forming the multilayer thin film structure 110' is removed (FIG. 16). Subsequently, the under bump metal 113 of the bottom surface of the multilayer thin film structure 110' is partially removed (FIG. 17). The under bump metal 113 may be formed of, for example, two or more metal layers 113*a* and 113*b*. The under bump metal 113 may be partially removed by remaining around a part being electrically connected to the redistribution layer 116. FIG. 18 is an enlarged view of a region X where the solder bump is formed, which shows a multilayer structure formed of the redistribution layer 116, an electrode pad 114 and a partial layer 113*b* of the under bump metal around the region where the solder bump is formed.

Figure 19:
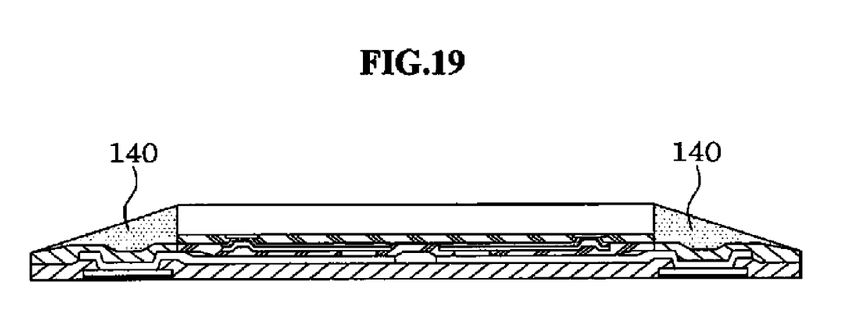

Subsequently, the molding part 140 is partially formed at one side of the multilayer thin firm structure in a lateral direction of the semiconductor chip (FIG. 19). The molding part 140 may be formed before the carrier (or wafer) 111 is removed from the multilayer thin film structure.

Figure 20:
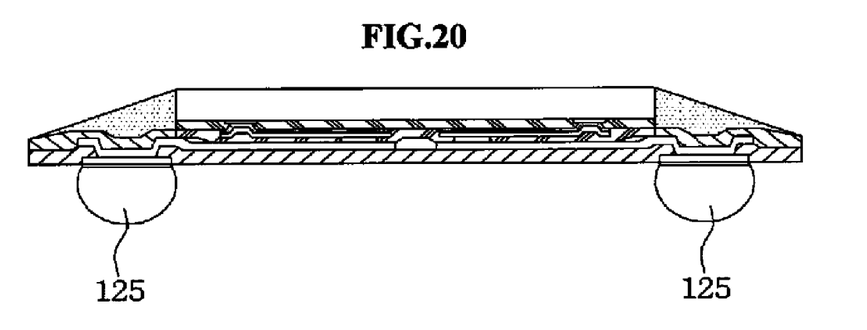

Finally, the solder bump 125 is formed to contact with the under bump metal 113 remaining on the bottom surface of the multilayer thin film structure 110', to complete the BGA package of the embodiment of the present invention (FIG. 20). The solder bump formed on the under bump metal 113 may be formed by the methods of ball attaching, electroplating, electroless plating, printing, sputtering and the like.

In the BGA package according to the present invention, the semiconductor chip positioned in the multilayer thin film structure may not include the redistribution layer, unlike the aforementioned embodiment.

Figure 21:
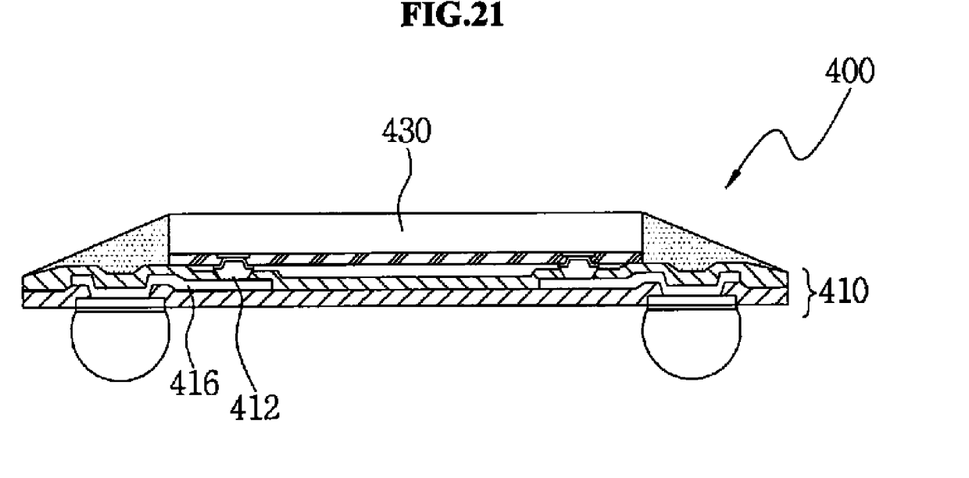
FIG. 21 is a sectional view of a semiconductor package structure according to another embodiment of the present invention.

FIG. 21 is a sectional view of a BGA package structure 400 according to another embodiment of the present invention, in which a semiconductor chip 430 including no redistribution layer is connected to a multilayer thin film structure 410 by a solder bump 412.

Figure 22:
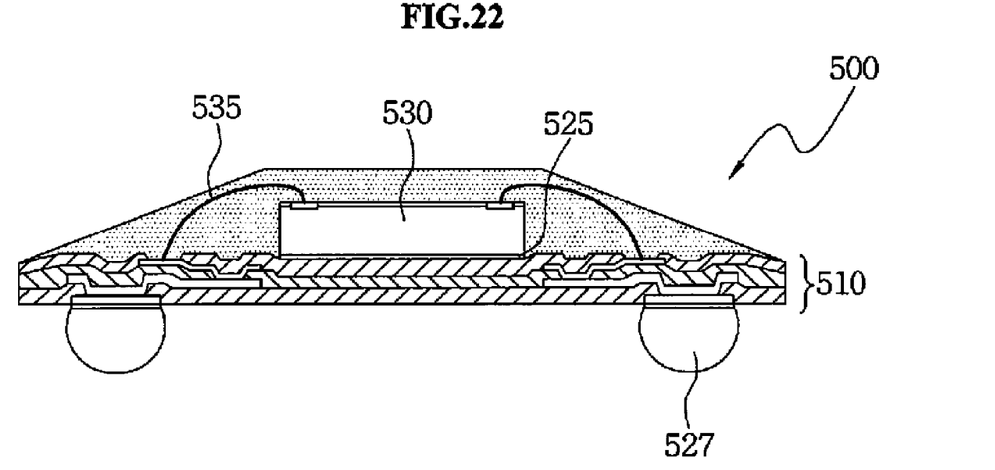
FIG. 22 is a sectional view of a semiconductor package structure according to another embodiment of the present invention.

In a BGA package 500 according to another embodiment of the present invention, a semiconductor chip 530 is electrically connected to a multilayer thin film structure 510 by a wire 535, as illustrated in FIG. 22. In this case, a bonding layer 525 is formed on the bottom surface of the semiconductor chip 530, to be bonded to one side of the multilayer thin film structure 510.

Figure 23:
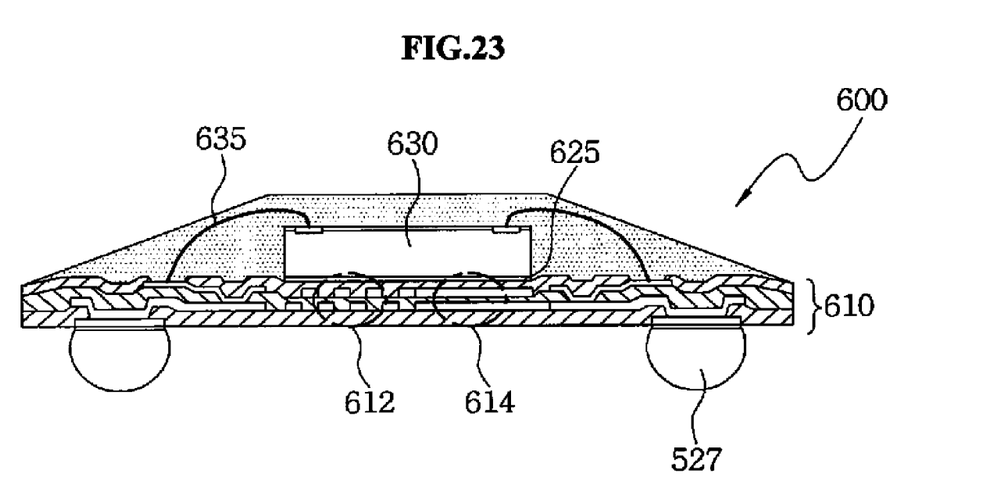
FIG. 23 is a sectional view of a semiconductor package structure according to another embodiment of the present invention.

FIG. 23 is a sectional view of a BGA package structure 600 according to another embodiment of the present invention, in which thin film devices are embedded in a multilayer thin film structure. The thin film device may include a passive device, such as, for example, an inductor 612 or a capacitor 614. The multilayer thin film structure including the thin film device may be applied to the BGA packages of FIGS. 2 through 4 in the same manner.

FIGS. 24 through 31 illustrate a process of fabricating a BGA package by applying a semiconductor chip including no redistribution layer to a multilayer thin film structure.

Figure 24:
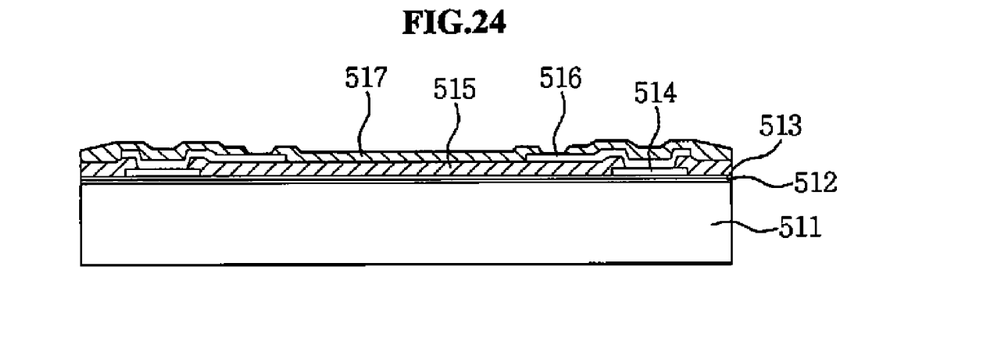
FIGS. 24 through 31 are sectional views illustrating a process of fabricating a semiconductor package according to another embodiment of the present invention.
Figure 25:
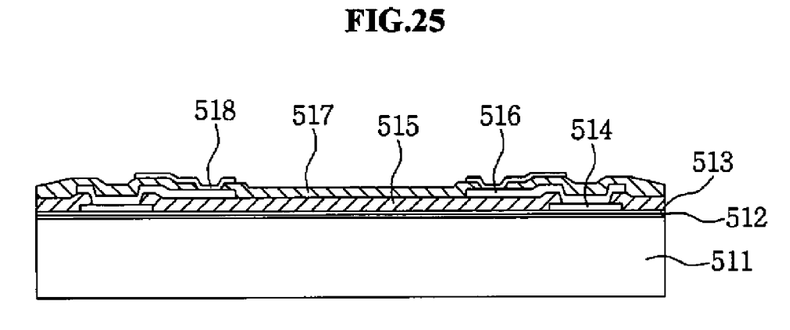

In the multilayer thin film structure of FIG. 24, after a bonding layer 512 and an under bump metal 513 are formed on a carrier (or wafer) 511, an electrode pad 514, a first dielectric layer 515, a first redistribution layer 516 and a second dielectric layer 517 are sequentially stacked. This structure is similar to the multilayer thin film structure in the aforementioned embodiment (of FIG. 9) in which the second dielectric layer is formed.

Figure 26:
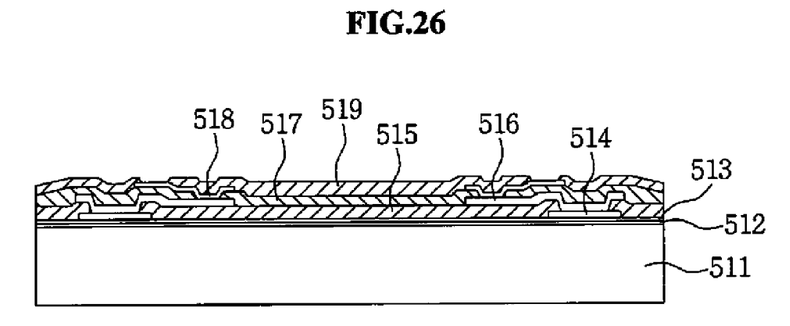

In the multilayer thin film structure in which the first redistribution layer 516 is formed, a second redistribution layer 518 is formed to be partially connected to the first redistribution layer 516 at carrier level or wafer level (FIG. 25), and a third dielectric layer 519 is formed to partially expose the second redistribution layer 518 (FIG. 26).

Figure 27:
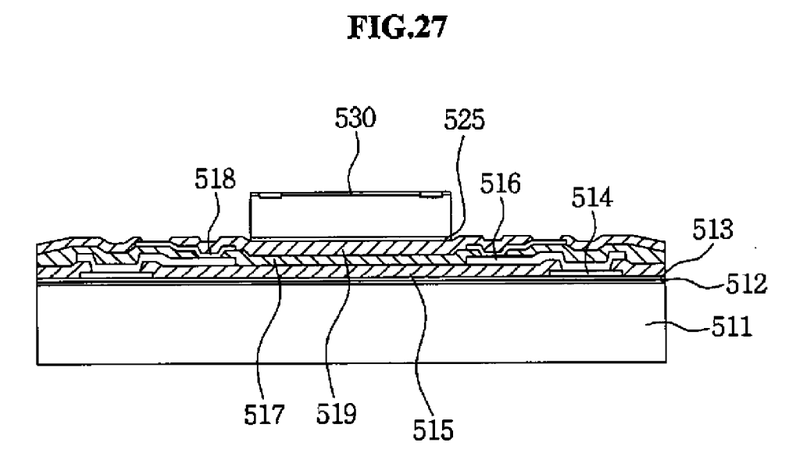

Subsequently, a semiconductor chip 530 which is fabricated at wafer level and then selected through the test is bonded to the top surface of the multilayer thin film structure (FIG. 27). For the bonding of the semiconductor chip 530, an additional bonding layer 525 may be used.

Figure 28:
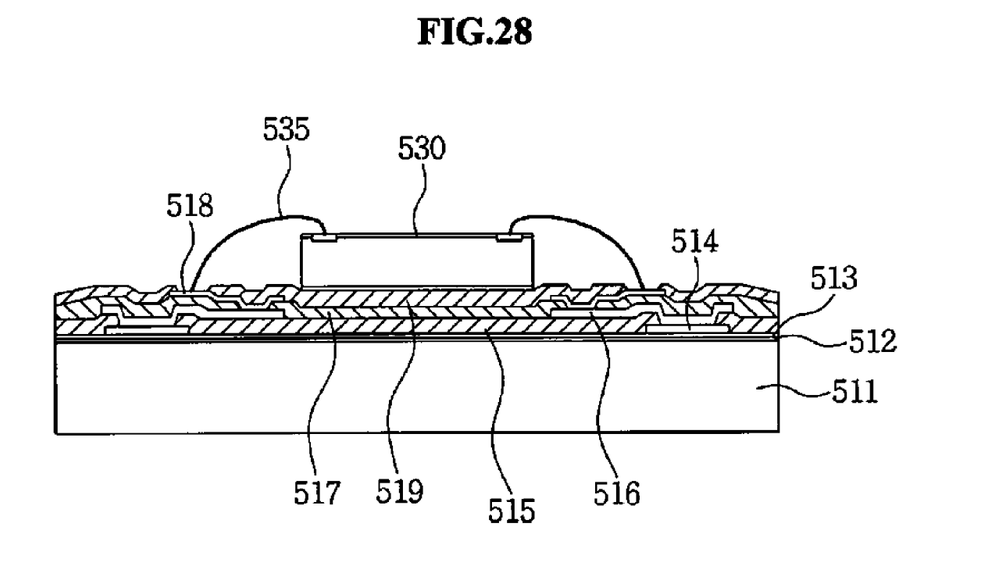
Figure 29:
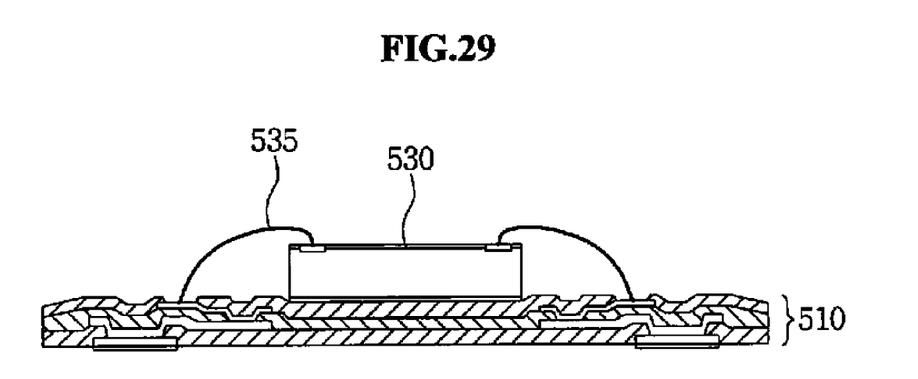

Subsequently, a part of the semiconductor chip 530 is electrically connected to the exposed part of the second redistribution layer 518 of the multilayer thin film structure by a wire 535 (FIG. 28). Subsequently, the carrier (or wafer) 511 bonded to the bottom surface of the multilayer thin film structure 510 is removed and continuously the under bump metal 513 of the bottom surface of the multilayer thin film structure is partially removed (FIG. 29).

Figure 30:
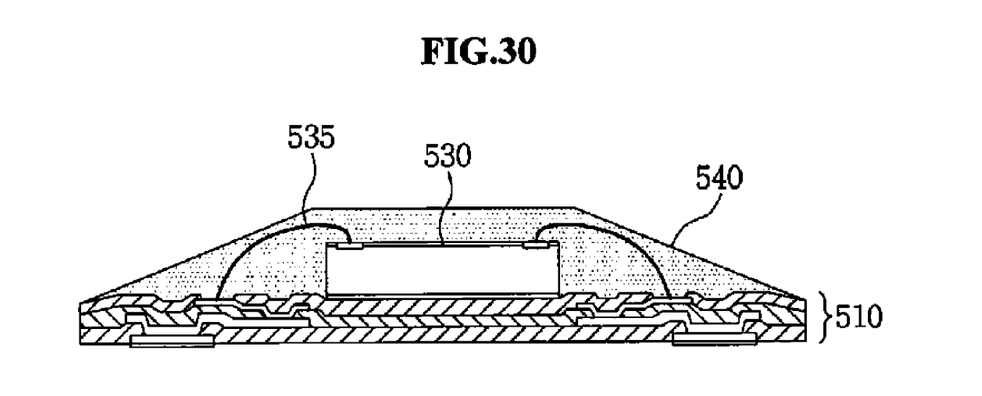

Subsequently, a molding part 540 is formed on the top surface of the multilayer thin film structure 510 and semiconductor chip 530, to cover the wire 535 (FIG. 30).

Figure 31:
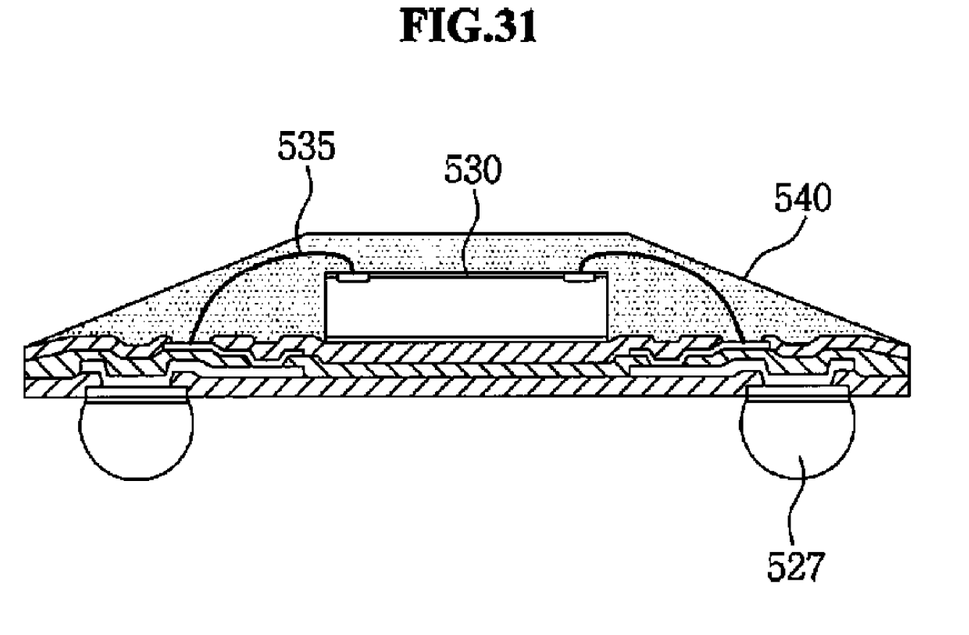

Finally, a solder bump 527 is formed to be connected to the under bump metal 513 remaining on the bottom surface of the multilayer thin film structure, to complete the BGA package according to the embodiment of the present invention (FIG. 31).

In the present invention, the first dielectric layer, the second dielectric layer or the third dielectric layer may be formed of dielectric materials, for example, such as polyimide, BCB, silicon oxide, silicon nitride and the like, and the redistribution layer may be formed of the materials, such as copper, gold, aluminum, tungsten and the like. However, the dielectric layers and the redistribution layer may be formed of other materials, and the present invention does not limit the materials thereof.

As described above, in accordance with the present invention, the multilayer thin film structure functions as the substrate for the semiconductor package and realizes the light, thin, short and small BGA package without any additional substrate. Furthermore, a plurality of the packages can be simultaneously formed at wafer level or carrier level, to simplify the process and to be favorable for mass production. Furthermore, after a plurality of the semiconductor chips are simultaneously formed at wafer level, only the semiconductor chips having the excellent operation characteristic through the semiconductor chip test at wafer level are selectively bonded to the multilayer thin film structure, to provide the high quality package products in which the fault rate of the semiconductor chip is maximally reduced. The multilayer thin film structure is capable of performing the additional function of the thin film passive device being embedded inside. Furthermore, the BGA packages are vertically stacked or horizontally mounted on a separate printed circuit board, to realize the systemized package. The light, thin, short and small BGA package according to the present invention enables small and slim communication devices, displayers and other diverse electronic devices, to be contributed to the increase of the competitiveness of the products to which the BGA package is applied.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. A semiconductor package comprising:
   a supporting structure including:
      a first dielectric layer with at least one opening,
      a redistribution layer on the first dielectric layer, and
      a second dielectric layer on the redistribution layer, said second dielectric layer being within the at least one opening which exposes a part of the redistribution layer;
   a molding part on the second dielectric layer, said molding part formed around a center region of the second dielectric layer; and
      a semiconductor chip positioned at the center region of the second dielectric layer and electrically connected to the redistribution layer of the support structure, the semiconductor chip including a redistribution layer formed thereon,
      wherein the redistribution layer of the semiconductor chip is coupled to the redistribution layer of the supporting structure, and
      wherein the molding part directly contacts the second dielectric layer in a region where the molding part overlies the second dielectric layer.

2. The semiconductor package of claim 1, wherein the redistribution layer of the semiconductor chip is electrically connected to the redistribution layer of the supporting structure through a bump.

3. The semiconductor package of claim 1, wherein the semiconductor chip is electrically connected to the redistribution layer of the supporting structure through a wire.

4. The semiconductor package of claim 1, wherein the molding part is lower than a top surface of the semiconductor chip, the molding part exposing the center region of the second dielectric layer.

5. The semiconductor package of claim 1, further comprising at least one or more other semiconductor chips stacked on the top surface of the semiconductor chip.

6. The semiconductor package of claim 5, wherein the semiconductor chip is electrically connected to the redistribution layer of the supporting structure through a bump, and the other semiconductor chip is electrically connected to the redistribution layer of the supporting structure through the wire.

7. The semiconductor package of claim 1, wherein the the supporting structure comprises a thin film passive device inside.

8. The semiconductor package of claim 7, wherein the thin film passive device comprises at least one of a capacitor, an inductor and a resistor.

9. The semiconductor package of claim 1, further comprising at least one metal layer formed between the redistribution layer of the supporting structure and a solder bump formed on the first dielectric layer and electrically connected to the redistribution layer of the supporting structure.

10. The semiconductor package of claim 9, wherein the metal layer comprises an electrode pad and an under bump metal.

11. The semiconductor package of claim 10, wherein the under bump metal includes Au.

12. The semiconductor package of claim 1, wherein the redistribution layer of the supporting structure has another redistribution layer electrically connected to the redistribution layer of the supporting structure.

13. The semiconductor package of claim 12, wherein the semiconductor chip is electrically connected to the other redistribution layer by the wire.

14. The semiconductor package of claim 1, further comprising a heat spreader contacting with the top surface of the semiconductor chip.

15. A semiconductor package comprising:
   a supporting structure including:
      a first dielectric layer with at least one opening,
      a redistribution layer on the first dielectric layer, and
      a second dielectric layer on the redistribution layer, said second dielectric layer being within the at least one opening which exposes a part of the redistribution layer;
   a molding part on the second dielectric layer, said molding part formed around a center region of the second dielectric layer; and
   a semiconductor chip positioned at the center region of the second dielectric layer and electrically connected to the redistribution layer of the supporting structure, the semiconductor chip including a chip pad,
   wherein the redistribution layer of the supporting structure is directly connected to a solder bump formed on the chip pad, and
      wherein the molding part directly contacts the second dielectric layer in a region where the molding part overlies the second dielectric layer.

16. A semiconductor package comprising:
   a supporting structure including:
      a first dielectric layer with at least one opening,
      a redistribution layer on the first dielectric layer, and
      a second dielectric layer on the redistribution layer, said second dielectric layer being within the at least one opening which exposes a part of the redistribution layer,
   a molding part on the second dielectric layer, said molding part formed around a center region of the second dielectric layer; and
      a semiconductor chip positioned at the center region of the second dielectric layer and electrically connected to the redistribution layer of the supporting structure, the semiconductor chip including a redistribution layer formed thereon,
      wherein the redistribution layer of the semiconductor chip is coupled to the redistribution layer of the supporting structure.

* * * * *